(12) United States Patent
Zhan et al.

(10) Patent No.: US 12,525,969 B2
(45) Date of Patent: Jan. 13, 2026

(54) DRIVE ACCELERATION CIRCUIT AND CIRCUIT SYSTEM

(71) Applicant: Huawei Digital Power Technologies Co., Ltd., Shenzhen (CN)

(72) Inventors: Jinxiang Zhan, Shanghai (CN); Ting Yu, Shanghai (CN)

(73) Assignee: HUAWEI DIGITAL POWER TECHNOLOGIES CO., LTD., Shenzhen (CN)

(*) Notice: Subject to any disclaimer, the term of this patent is extended or adjusted under 35 U.S.C. 154(b) by 30 days.

(21) Appl. No.: 18/239,871

(22) Filed: Aug. 30, 2023

(65) Prior Publication Data

US 2024/0072784 A1    Feb. 29, 2024

(30) Foreign Application Priority Data

Aug. 31, 2022   (CN) .......................... 202211054162.4

(51) Int. Cl.
*H03K 17/04*    (2006.01)
*H03K 17/567*   (2006.01)

(52) U.S. Cl.
CPC ....... *H03K 17/0406* (2013.01); *H03K 17/567* (2013.01); *H03K 2217/0081* (2013.01)

(58) Field of Classification Search
CPC ............. H03K 17/0406; H03K 17/567; H03K 2217/0081; H03K 17/168; Y02B 70/10; H02M 1/08; H02M 1/0003; H02M 1/0009
See application file for complete search history.

(56) References Cited

U.S. PATENT DOCUMENTS

2014/0055190 A1    2/2014  Kaneko et al.

FOREIGN PATENT DOCUMENTS

| CN | 102810973 A  | * | 12/2012 | ........... H03K 17/162 |
|----|--------------|---|---------|-------------------------|
| CN | 106465502 B  |   | 10/2018 |                         |
| CN | 113098240 A  | * | 7/2021  | .............. H02M 1/32 |
| CN | 216774743 U  | * | 6/2022  |                         |
| JP | 2015204661 A |   | 11/2015 |                         |
| WO | 2010132460 A2|   | 11/2010 |                         |

* cited by examiner

*Primary Examiner* — Metasebia T Retebo
(74) *Attorney, Agent, or Firm* — WOMBLE BOND DICKINSON (US) LLP

(57) ABSTRACT

A drive acceleration circuit, including: a drive power supply, including an output end and a reference signal end, where the output end output a drive signal, and the reference signal end is connected to a connection end of a switching device and output a reference signal to the connection end; a first signal route, where the first signal route is connected to the output end of the drive power supply and a control end of the switching device, and is configured to drive, based on the drive signal, the switching device to turn on/off; and a second signal route, connected in parallel with the first signal route, including a drive acceleration unit and a selective conduction unit, one end of the drive acceleration unit is connected to the drive power supply, another end of the drive acceleration unit is connected to the switching device through the selective conduction unit.

20 Claims, 14 Drawing Sheets

DRIVE ACCELERATION CIRCUIT AND CIRCUIT SYSTEM

CROSS-REFERENCE TO RELATED APPLICATIONS

This application claims priority to Chinese Patent Application No. 202211054162.4, filed on Aug. 31, 2022, the disclosure of which is hereby incorporated by reference in its entirety.

TECHNICAL FIELD

This application relates to the field of electronic circuit technologies, and in particular, to a drive acceleration circuit and a circuit system.

BACKGROUND

Semiconductor switching devices such as insulated gate bipolar transistors (IIGBT), metal-oxide-semiconductor field-effect transistors (MOSFET), and new-type wide bandgap semiconductors (including wide bandgap semiconductor materials such as SiC and GaN) are widely applied in electronic circuits. In some application scenarios, to reduce conduction losses of a switching device, a switching device with a slow switching speed is considered. However, the switching device is also expected to operate in a highly frequent on/off switching state. In this case, a drive acceleration circuit is required to ensure that a slow semiconductor switching device has highly frequent on/off switching capabilities. However, in some cases, the drive acceleration circuit causes the switching device to turn off abruptly. This greatly increases stress, posing stress risks to the switching device.

SUMMARY

A first aspect of this application provides a drive acceleration circuit, configured to drive a switching device to turn on or turn off. The switching device has a control end and a connection end. The drive acceleration circuit includes: a drive power supply, including an output end and a reference signal end, where the output end is configured to output a drive signal, and the reference signal end is coupled to the connection end of the switching device and is configured to output a reference signal to the connection end; a first signal route, where the first signal route is coupled to the output end of the drive power supply and the control end of the switching device, and is configured to drive, based on the drive signal, the switching device to turn on or turn off; and a second signal route, which is connected in parallel with the first signal route, where the second signal route includes a drive acceleration unit and a selective conduction unit, one end of the drive acceleration unit is coupled to the output end of the drive power supply, another end of the drive acceleration unit is coupled to the control end of the switching device through the selective conduction unit, the selective conduction unit is turned on in a time division manner to make the second signal route closed or open, and the drive acceleration unit is configured to accelerate on/off of the switching device based on the drive signal when the second signal route is closed.

The drive acceleration circuit includes the first signal route and the second signal route. The first signal route is configured to drive the switching device to turn on or turn off. The second signal route includes the drive acceleration unit and the selective conduction unit. The selective conduction unit may control the second signal route to be closed or open, so that the drive acceleration unit in the second signal route is included in the drive acceleration circuit or excluded from the drive acceleration circuit. When included in the drive acceleration circuit, the drive acceleration unit is also configured to drive the switching device to turn on or turn off. Based on a working characteristic of the switching device, in some specific working periods of the switching device, when the drive acceleration unit drives the switching device, a turn-on speed or a turn-off speed of the switching device may be accelerated. However, in some other specific working periods of the switching device, the drive acceleration unit may cause a current of the switching device to change excessively rapidly, increasing stress. Therefore, a switch control circuit is disposed in the drive acceleration circuit to control a working status (closed or open) of the second signal route, thereby controlling the drive acceleration unit to be included in some specific periods and excluded in some other specific periods. In this way, in addition to improving turn-on and turn-off speeds of the switching device, the drive acceleration circuit further avoids a risk of increasing stress of the switching device.

In some embodiments, the selective conduction unit includes at least one semiconductor device, one end of the at least one semiconductor device is connected to the drive acceleration unit, another end of the at least one semiconductor device is connected to the control end of the switching device, and the at least one semiconductor device is turned on or off in a time division manner to make the second signal route closed or open.

In some embodiments, the at least one semiconductor device is a zener diode, a transient voltage suppressor, or a switching device.

In this way, the semiconductor device (a zener diode, a transient voltage suppressor, or a switching device) is disposed. This is conducive to controlling the second signal route to be closed or open.

In some embodiments, the selective conduction unit includes two semiconductor devices, and either of the semiconductor devices is a zener diode or a transient voltage suppressor. Anodes of the two semiconductor devices are coupled to each other, a cathode of one semiconductor device is coupled to the drive acceleration unit, and a cathode of the other semiconductor device is coupled to the control end of the switching device.

In this way, connection directions of the two semiconductor devices are opposite to each other. Driven by drive signals of different directions, the two semiconductor devices enter a conduction or reverse cutoff state, so that the drive acceleration unit in the second signal route can be included in the drive acceleration circuit in both turn-on and turn-off processes of the switching device. This is conducive to both accelerating a turn-on process of the switching device and accelerating a turn-off process of the switching device.

In some embodiments, the drive acceleration circuit includes at least two second signal routes that are connected in parallel, and the at least two second signal routes are closed in a time division manner.

In this way, a turn-on process and/or a turn-off process of the switching device can be accelerated in a time division manner by using a plurality of second signal routes.

In some embodiments, the second signal routes are of the same structure.

This is conducive to calculating and selecting a parameter (such as a resistance value or a capacitance value) of a corresponding component in each second signal route.

In some embodiments, the second signal routes have different resistance values.

In this way, a turn-on process and/or a turn-off process of the switching device can be accelerated at different speeds in different periods by controlling the second signal routes to be closed in a time division manner.

In some embodiments, the second signal route is configured to be in a closed state when the switching device is in a turn-off delay period, and to be in an open state when the switching device is in a turn-off action period; or the second signal route is configured to be in a closed state both when the switching device is in a turn-off delay period and when the switching device is in a turn-off action period.

In this way, when the second signal route is closed in the turn-off delay period and is open in the turn-off action period, this is conducive to shortening the turn-off delay period of the switching device without affecting the turn-off action period of the switching device, thereby further avoiding increasing stress of the switching device while reducing a turn-off delay of the switching device.

In some embodiments, the second signal route is configured to be in a closed state when the switching device is in a turn-on delay period, and to be in an open state when the switching device is in a turn-on action period; or the second signal route is configured to be in a closed state both when the switching device is in a turn-on delay period and when the switching device is in a turn-on action period.

In this way, when the second signal route is closed in the turn-on delay period and is open in the turn-on action period, this is conducive to shortening the turn-on delay period of the switching device without shortening the turn-on action period of the switching device, thereby further avoiding increasing stress of the switching device while accelerating a turn-on process of the switching device.

In some embodiments, the drive acceleration unit includes any one or combination of a resistor, a capacitor, and a diode, one end of one of the resistor, the capacitor, and the diode or one end of any combination of the resistor, the capacitor, and the diode that are connected in series or parallel is coupled to the output end of the drive power supply, and another end thereof is coupled to the selective conduction unit.

In this way, a charging and discharging path can be provided in the turn-on delay period and the turn-off delay period of the switching device.

In some embodiments, the first signal route includes a first resistor, one end of the first resistor is connected to the output end of the drive power supply, and another end of the first resistor is connected to the control end of the switching device; and the drive acceleration unit includes a second resistor, where one end of the second resistor is connected to the output end of the drive power supply, and another end of the second resistor is connected to the selective conduction unit.

In this way, a current of the first signal route remains less than a current of the second signal route when the second signal route is closed. When the second signal route is closed, a turn-on delay or/and a turn-off delay is reduced. When the first signal route is closed, a current change rate of the switching device remains normal in turn-on and turn-off processes.

In some embodiments, the drive acceleration unit further includes a capacitor that is connected in series with the second resistor, the one end of the second resistor is connected to the output end of the drive power supply, the another end of the second resistor is connected to the capacitor, another end of the capacitor is connected to the selective conduction unit, and the capacitor is configured to perform charging or discharging when the second signal route is closed.

This is conducive to improving a current on the second signal route in charging and discharging processes of the capacitor, thereby reducing a turn-on delay and/or a turn-off delay of the switching device.

In some embodiments, the drive acceleration unit further includes a third resistor, the third resistor is connected in parallel with the capacitor, one end of the third resistor is connected to the second resistor, another end of the third resistor is connected to the selective conduction unit, and the third resistor and the capacitor are included in the second signal route in a time division manner.

In this way, when the capacitor is included in the second signal route, the second signal route has a large current, thereby accelerating on or/and off of the switching device. When the third resistor is included in the second signal route, the second signal route has a small current, so that the switching device can normally turn on and turn off without being affected, thereby avoiding a risk of generating stress.

In some embodiments, a sum of the resistance value of the second resistor and a resistance value of the third resistor is greater than the resistance value of the first resistor.

In this way, when the third resistor is included in the second signal route, a current on the second signal route is less than a current on the first signal route. The switching device performs charging and discharging mainly by using the first signal route. The switching device can maintain a relatively small current change rate during normal turn-on and turn-off action periods. This is conducive to avoiding a risk of stress.

A second aspect of this application provides a circuit system, including: a switching device, which has a control end and a connection end; and the drive acceleration circuit according to any one of the foregoing embodiments, where the drive acceleration circuit is coupled to the control end and the connection end of the switching device, and is configured to drive on/off of the switching device.

The circuit system includes the drive acceleration circuit, and the drive acceleration circuit includes a first signal route and a second signal route. The first signal route is configured to drive the switching device to turn on or turn off. The second signal route includes a drive acceleration unit and a selective conduction unit. The selective conduction unit may control the second signal route to be closed or open, so that the drive acceleration unit in the second signal route is included in the drive acceleration circuit or excluded from the drive acceleration circuit. When included in the drive acceleration circuit, the drive acceleration unit is also configured to drive the switching device to turn on or turn off. Based on a working characteristic of the switching device, in some specific working periods of the switching device, when the drive acceleration unit drives the switching device, a turn-on speed or a turn-off speed of the switching device may be accelerated. However, in some other specific working periods of the switching device, the drive acceleration unit may cause a current of the switching device to change excessively rapidly, increasing stress. Therefore, a switch control circuit is disposed in the drive acceleration circuit to control a working status (closed or open) of the second signal route, thereby controlling the drive acceleration unit to be included in some specific periods and excluded in some other specific periods. In this way, in addition to improving turn-on and turn-off speeds of the switching device, the circuit system and the drive acceleration circuit further avoid a risk of increasing stress of the switching device.

REFERENCE NUMERALS

| | |
|---|---|
| Circuit system | 1, 2, and 3 |
| Drive acceleration circuit | 10 |
| Drive power supply | 11 |
| Output end | out |
| Basic drive unit | 12 |
| Drive acceleration unit | 13 |
| Selective conduction unit | 14 |
| First signal route | 15 |
| Second signal route | 16 |
| First resistor | R1 |
| Second resistor | R2 |
| Third resistor | R3 |
| Capacitor | C |
| First zener diode | $V_{Z1}$ |
| Second zener diode | $V_{Z2}$ |
| Switching device | 20 |
| Control end | G |
| Connection end | E |
| Reference signal end | GND |
| Period | $T_1$, $T_2$, $T_4$, and $T_5$ |

DETAILED DESCRIPTION

The following describes embodiments of this application with reference to accompanying drawings of embodiments of this application.

It should be noted that when an element is considered to "be connected" to another element, it may be directly connected to the another element, or an element disposed in between may coexist. When one or more elements or units are considered to "constitute" or "serve as" another element, it only indicates that the relationship exists in the described embodiment.

Unless otherwise specified, all the technical and scientific terms used in this specification have the same meanings as those generally understood by technical personnel in the technical field of this application. Terms used in this specification of this application are merely intended for the purpose of describing specific embodiments rather than limiting this application. The term "and/or" used in this specification includes any and all combinations of one or more associated items that are listed.

This application provides a circuit system that includes a drive acceleration circuit and a switching device. The circuit system is applied to a drive circuit of a semiconductor switching device. The drive acceleration circuit is configured to drive the switching device to turn on and turn off. In this application, the switching device is a semiconductor switching device, for example, an insulated gate bipolar transistor, a metal-oxide-semiconductor field-effect transistor, or a new-type wide bandgap semiconductor. The switching device has a control end. The drive acceleration circuit outputs a drive signal to the control end of the switching device, to drive the switching device to turn on and turn off.

Figure 1:
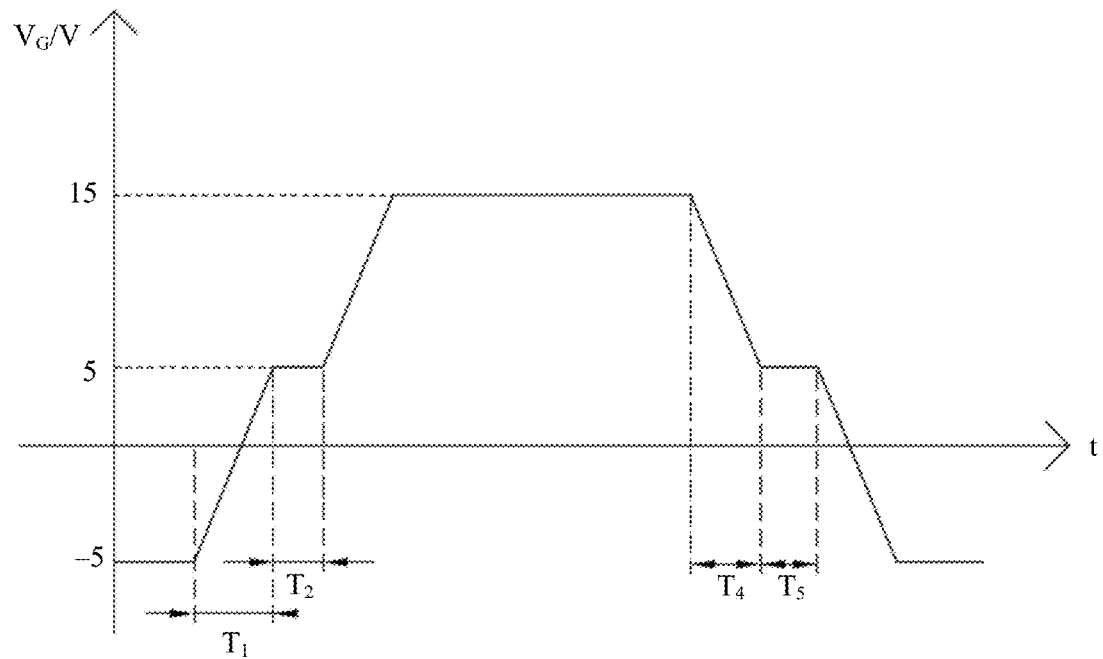
FIG. 1 is a schematic diagram of an I-V curve of a switching device when a drive power supply outputs a drive signal with a large pulse.

In an embodiment this application, for an I-V curve of an entire process in which the switching device starts to turn on until turn-off ends, refer to FIG. 1. In FIG. 1, a horizontal coordinate indicates time, and a vertical coordinate indicates a voltage $V_G$ of the control end of the switching device. $T_1$ is defined as a turn-on delay period of the switching device, $T_2$ is defined as a turn-on action period of the switching device, $T_4$ is defined as a turn-off delay period of the switching device, and $T_5$ is defined as a turn-off action period of the switching device. At a moment when the period $T_5$ ends, the switching device has been completely turned off. However, in a period following the period $T_5$, $V_G$ still continues to drop, until $V_G$ reaches a low level (−5V) of the drive signal.

In an embodiment of this application, a threshold voltage of the switching device is +5V. In other words, when the switching device reaches a miller plateau, a voltage $V_G$ at a gate is +5V. In other words, when $V_G$ reaches +5V, the switching device is turned on; and when $V_G$ is less than +5V, the switching device is turned off. The voltage of the drive signal periodically jumps between +15V and −5V. However, because of a working characteristic of the semiconductor switching device, $V_G$ of the switching device can hardly be switched instantaneously, but it takes some time to complete voltage switching. For example, in the turn-on delay period $T_1$ of the switching device, $V_G$ gradually increases from −5V to +5V; and in the turn-off delay period $T_4$ of the switching device, $V_G$ gradually decreases from +15V to +5V. Existence of the turn-on delay period $T_1$ and the turn-off delay period $T_4$ affects turn-on and turn-off speeds of the switching device.

In an embodiment this application, the basic drive unit 12 is configured to drive the switching device to turn on or turn off. The drive acceleration unit 13 is configured to be turned on in the turn-on delay period $T_1$ and the turn-off delay period $T_4$ of the switching device, to shorten the turn-on delay period $T_1$ and the turn-off delay period $T_4$ of the switching device, thereby reducing a turn-on delay and a turn-off delay.

Figure 2:
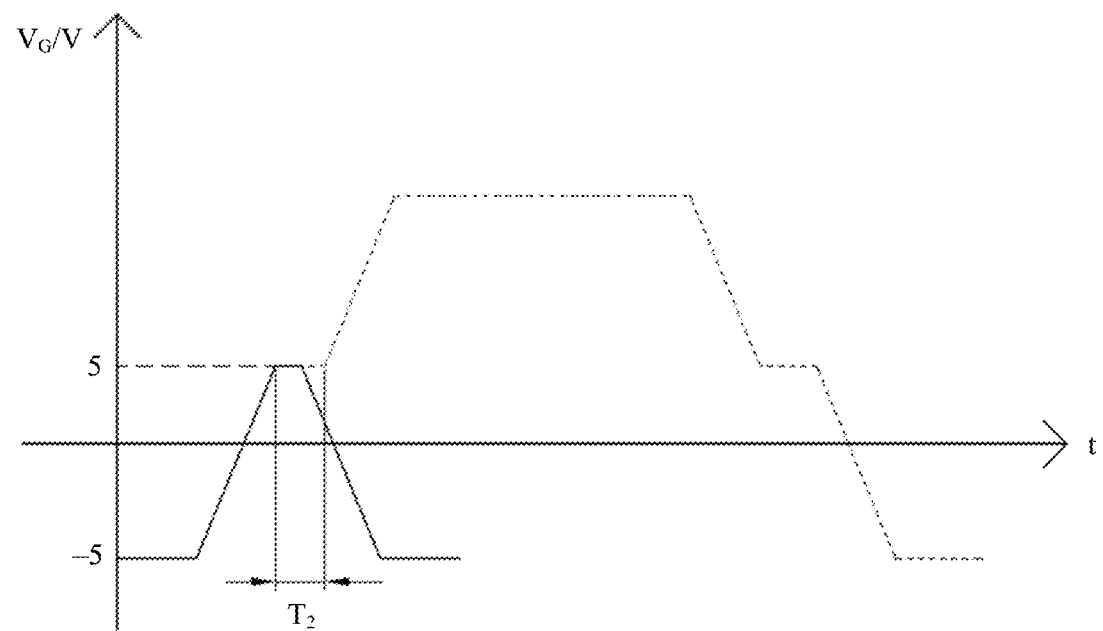
FIG. 2 is a schematic diagram of an I-V curve of a switching device when a drive power supply outputs a drive signal with a small pulse.

When a pulse width is large, an I-V curve of the switching device is shown in FIG. 1. Refer to FIG. 2. When a pulse width of the drive signal is small, in some cases, when $V_G$ just reaches +5V, in other words, when the switching device is in the turn-on action period $T_2$ and the switching device is just turned on, a level of the drive signal jumps from +15V to −5V, and the switching device immediately starts to turn off. If the drive acceleration unit 13 drives the switching device at this time, the miller plateau is directly accelerated. This speeds up a normal turn-off process of the switching device, and a current change rate suddenly increases, greatly increasing stress of the switching device and causing a risk of stress to the switching device.

It can be learned that delays (the turn-on delay period $T_1$ and the turn-off delay period $T_4$) of specific duration exist both in turn-on and turn-off processes of the switching device. If the turn-on delay period $T_1$ and the turn-off delay period $T_4$ of the switching device are shortened, this is conducive to reducing turn-on and turn-off delays of the switching device, thereby speeding up turn-on and turn-off speeds. However, when the pulse width of the drive signal is small, the miller plateau of the switching device is consequently accelerated. In other words, the normal turn-on action period $T_2$ and turn-off action period $T_5$ of the switching device are also shortened. This brings a risk of increased stress.

In an embodiment this application, a drive signal whose pulse width is greater than a sum of the turn-on delay period $T_1$ and the turn-on action period $T_2$ of the switching device is defined as a drive signal with a large pulse, and a drive signal whose pulse width is less than or equal to a sum of the turn-on delay period $T_1$ and the turn-on action period $T_2$ of the switching device is defined as a drive signal with a small pulse.

Embodiment 1

In this embodiment, a drive acceleration circuit 10 performs acceleration in a turn-on delay period $T_1$ and a turn-off delay period $T_4$ of a switching device, and is disconnected in a turn-on action period $T_2$ and a turn-off action period $T_5$ of the switching device. This resolves the foregoing technical problem that "when the pulse width of the drive signal is small, stress of the switching device is consequently increased."

Figure 3:
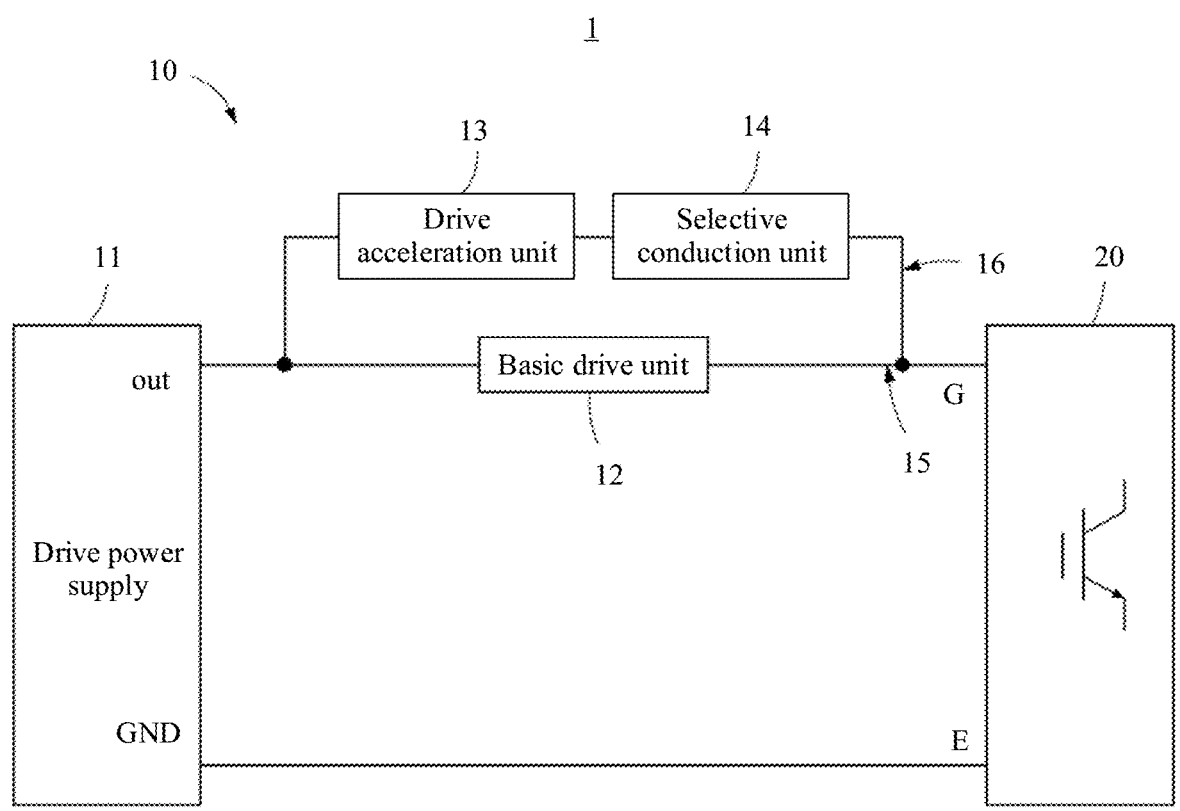
FIG. 3 is a schematic diagram of a modular structure of a circuit system according to an embodiment of this application.

Refer to FIG. 3. A circuit system 1 of this embodiment includes the drive acceleration circuit 10 and a switching device 20. In this embodiment, the switching device 20 has a control end G. The drive acceleration circuit 10 is coupled to the control end G of the switching device 20 to output a drive signal, thereby driving the switching device 20 to turn on or turn off. In this embodiment, as an example for description, the switching device 20 is an insulated gate bipolar transistor, and the control end G is a gate of the insulated gate bipolar transistor. The drive acceleration circuit 10 includes a drive power supply 11, a basic drive unit 12, a drive acceleration unit 13, and a selective conduction unit 14. In this embodiment, the basic drive unit 12 constitutes a first signal route 15, and the drive acceleration unit 13 and the selective conduction unit 14 serve as a second signal route 16 after being connected in series. The first signal route 15 and the second signal route 16 are configured to: when closed, provide a charging and discharging path for the switching device 20. The drive acceleration unit 13 and the selective conduction unit 14 are connected in series, and then connected to the basic drive unit 12 in parallel. In other words, the first signal route 15 and the second signal route 16 are connected in parallel.

The drive power supply 11 has an output end OUT and a signal reference end GND. The output end OUT is configured to output a drive signal, and the signal reference end GND is configured to output a reference signal that serves as a reference ground. The switching device 20 further includes a connection end E. In this embodiment, the connection end is an emitter. In another embodiment, the connection end E may alternatively be a collector. The signal reference end GND is coupled to the connection end E. The drive signal output by the output end OUT is applied to the control end G of the switching device 20. In this embodiment, the selective conduction unit 14 is configured to control a working status of the second signal route 16. In other words, the second signal route 16 is controlled by the selective conduction unit 14 to be in a closed or open state. In this way, the drive acceleration unit 13 is included in the drive acceleration circuit 10 or excluded from the drive acceleration circuit 10. (In other words, the drive acceleration unit 13 is connected to the drive acceleration circuit 10 or disconnected from the drive acceleration circuit 10.)

In this embodiment, the drive signal is a pulse signal. When the drive signal is in a first state (for example, a high level state, such as 15V), the switching device 20 is driven to turn on. When the drive signal is in a second state (for example, at a low level, such as −5V), the switching device 20 is driven to turn off.

In this embodiment, the selective conduction unit 14 controls the working status of the second signal route 16, so that the drive acceleration unit 13 is included in the turn-on delay period $T_1$ and the turn-off delay period $T_4$ of the switching device 20; and the selective conduction unit 14 controls the working status of the second signal route 16, so that the drive acceleration unit 13 is excluded in the turn-on action period $T_2$ and the turn-off action period $T_5$ of the switching device 20. In other words, the selective conduction unit 14 controls the second signal route 16 to be in a closed state in the turn-on delay period $T_1$ and the turn-off delay period $T_4$ of the switching device 20; and the selective conduction unit 14 controls the second signal route 16 to be in an open state in the turn-on action period $T_2$ and the turn-off action period $T_5$ of the switching device 20.

The basic drive unit 12 and the drive acceleration unit 13 include one of or any combination of a resistor, a capacitor, and a diode. There is one or more resistors, capacitors, and diodes. The one or more resistors, capacitors, and diodes may be connected in series or in parallel.

Figure 4:
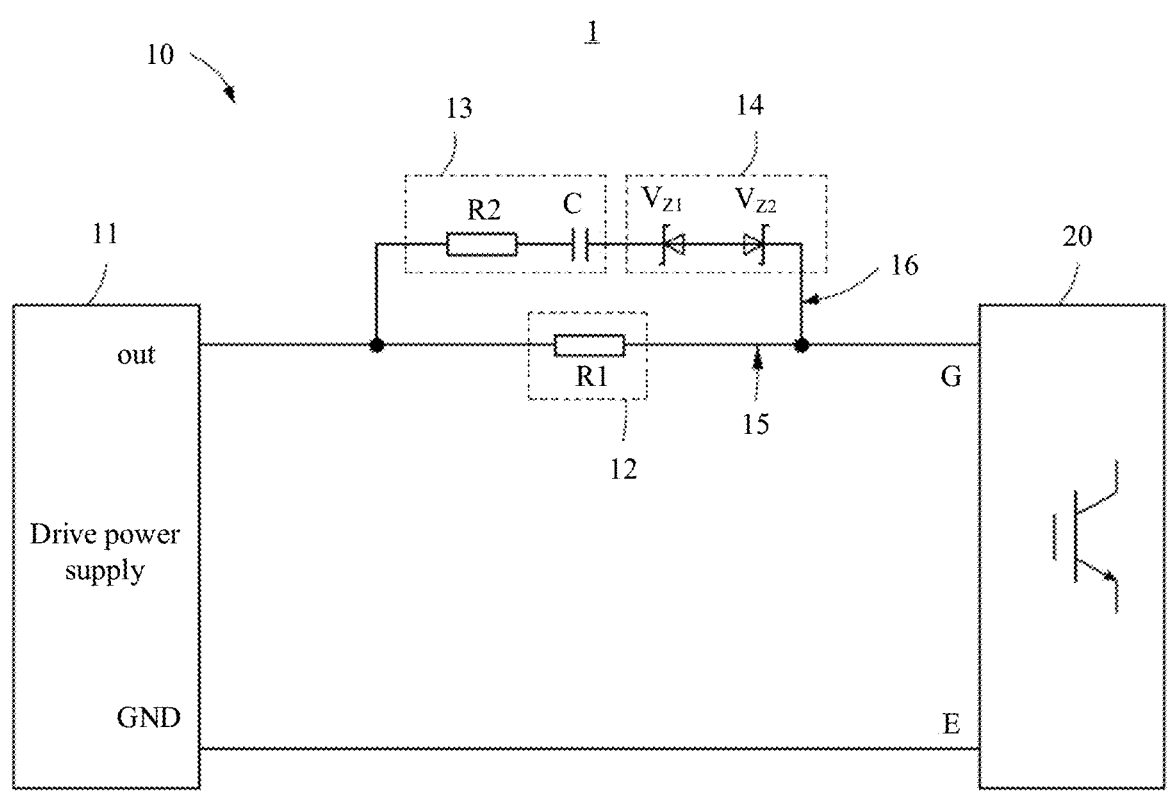
FIG. 4 is a schematic diagram of a circuit structure of a circuit system according to an embodiment of this application.

Refer to FIG. 4. In this embodiment, the basic drive unit 12 includes a first resistor R1, the drive acceleration unit 13 includes a second resistor R2 and a capacitor C, and the selective conduction unit 14 includes a first zener diode $V_{Z1}$ and a second zener diode $V_{Z2}$. The second resistor R2, the capacitor C, the first zener diode $V_{Z1}$, and the second zener diode $V_{Z2}$. are consecutively connected in series. The second resistor R2 is further coupled to the output end OUT of the drive power supply 11. The second zener diode $V_{Z2}$ is further coupled to the control end G of the switching device 20. In this embodiment, a negative electrode of the first zener diode $V_{Z1}$ is coupled to the output end OUT of the drive power supply 11, and a positive electrode of the first zener diode $V_{Z1}$ is coupled to the switching device 20. A positive electrode of the second zener diode $V_{Z2}$ is coupled to the output end OUT of the drive power supply 11, and a negative electrode of the second zener diode $V_{Z2}$ is coupled to the switching device 20. The first resistor R1 is coupled between the output end OUT of the drive power supply 11 and the control end G of the switching device 20, and is connected in parallel with the second resistor R2, the capacitor C, the first zener diode $V_{Z1}$, and the second zener diode $V_{Z2}$.

In this embodiment, a working principle of the circuit system 1 shown in FIG. 4 is illustrated by using an example in which a threshold voltage of the switching device 20 is 5V, and breakdown voltages of the first zener diode $V_{Z1}$ and the second zener diode $V_{Z2}$ are 10V.

Figure 5:
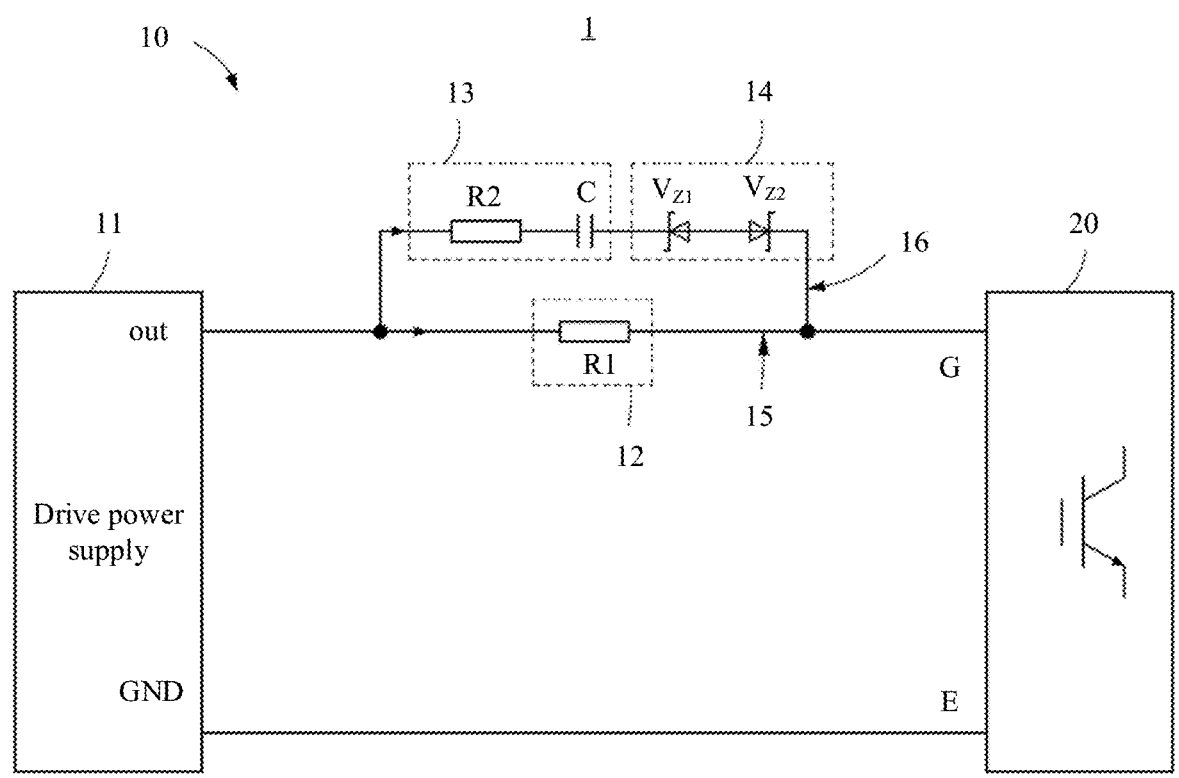
FIG. 5 is a schematic diagram of a structure of an equivalent circuit of the circuit system in FIG. 4 in a turn-on delay period of a switching device.

Refer to FIG. 5. The drive signal is in a high level (+15V) state in the turn-on delay period $T_1$. When driven by the drive signal, a voltage $V_G$ of the control end G of the switching device 20 gradually increases from −5V to the threshold voltage of +5V (which is a miller plateau of the switching device 20 in this embodiment). At this time, the first zener diode $V_{Z1}$ enters a reverse breakdown state, with a working voltage of 10V. The second zener diode $V_{Z2}$ enters a forward conduction state, and acts as a diode. At this time, both the first signal route 15 and the second signal route 16 are in a closed state. In the second signal route 16, the second resistor R2 and the capacitor C can provide a sufficient gate drive peak current. In this way, the switching device 20 is charged by using the first signal route 15, and the charging is accelerated by using the second signal route 16, to accelerate a turn-on delay process of the switching device 20.

Figure 6:
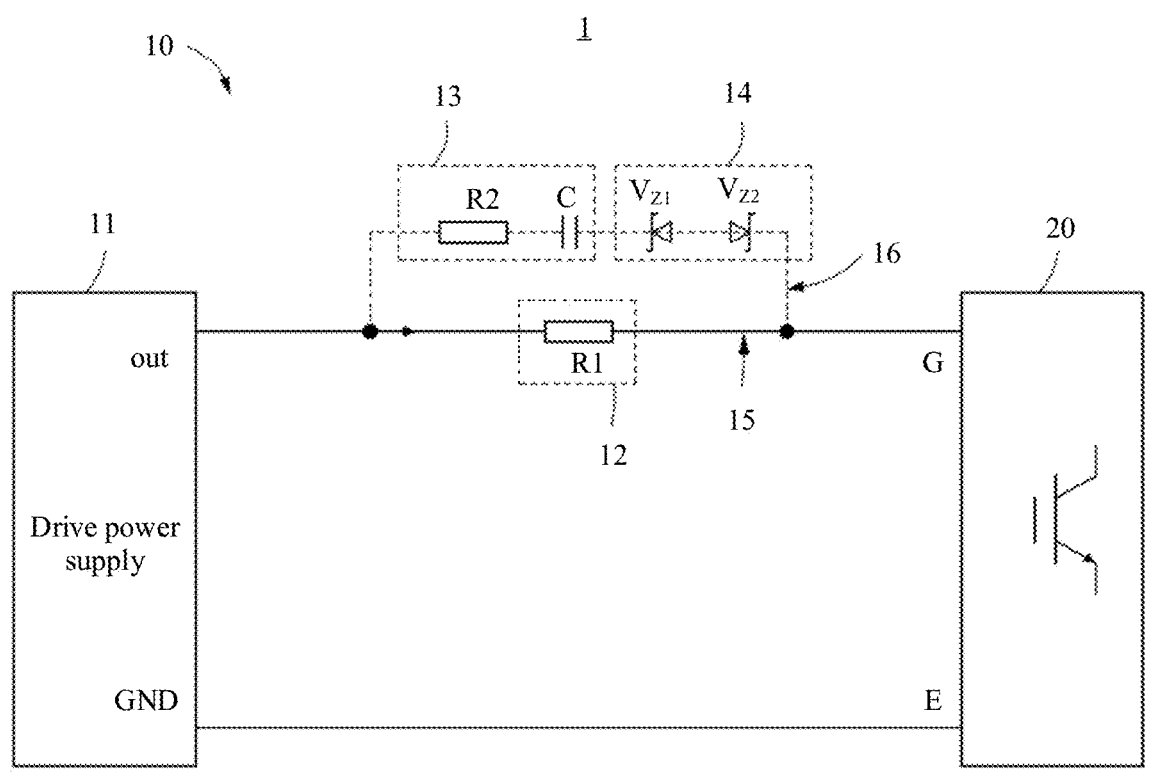
FIG. 6 is a schematic diagram of a structure of an equivalent circuit of the circuit system in FIG. 4 in a turn-on action period of a switching device.

Refer to FIG. 6. A voltage $V_G$ of the control end G has reached the threshold voltage of +5V of the switching device in the turn-on action period $T_2$. At this time, the switching device 20 is turned on, and the first zener diode $V_{Z1}$ in the selective conduction unit 14 is cut off, so that the second signal route 16 is in an open state. At this time, only the first signal route 15 is closed, and the switching device 20 is charged only by using the first signal route 15. Therefore, a charging speed is reduced in comparison with that in the turn-on delay period, and a small current change rate is maintained for the switching device 20, thereby avoiding a risk of stress.

During normal operation of the switching device 20, the first signal route 15 constantly stays in a closed state, and the second signal route 16 constantly stays in an open state. Although the voltage $V_G$ of the control end G has exceeded +5V and the switching device 20 has been turned on, to prevent the switching device 20 from being erroneously turned off due to fluctuation of the drive signal, a high level of the drive signal needs to be greater than +5V. Therefore, the voltage $V_G$ of the control end G continues to increase to +15V after reaching the miller plateau.

Figure 7:
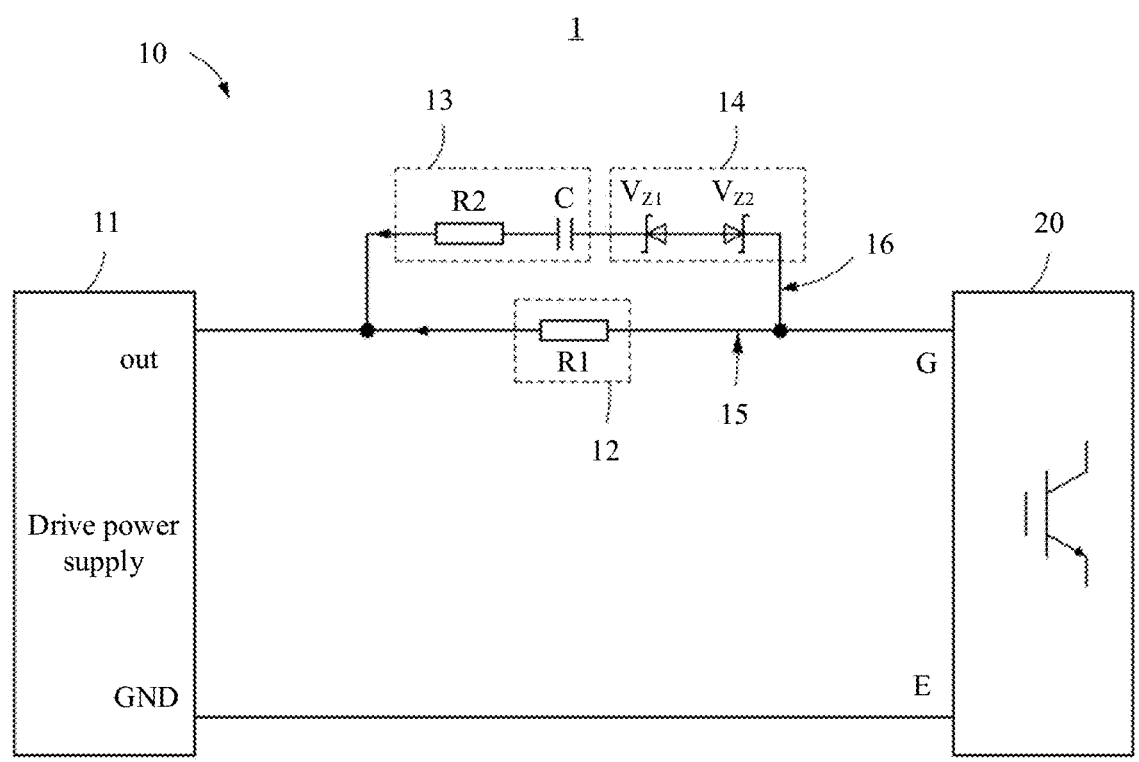
FIG. 7 is a schematic diagram of a structure of an equivalent circuit of the circuit system in FIG. 4 in a turn-off delay period of a switching device.

Refer to FIG. 7. The drive signal is in a low level (−5V) state in the turn-off delay period $T_4$. When driven by the drive signal, a voltage of the control end G of the switching device 20 gradually decreases from +15V to +5V. At this time, the first zener diode $V_{Z1}$ enters a forward conduction state and acts as a diode. The second zener diode $V_{Z2}$ enters a reverse breakdown state, with a working voltage of 10V. At this time, both the first signal route 15 and the second signal route 16 are in a closed state. In the second signal route 16, the second resistor R2 and the capacitor C can provide a discharging path that has a low impedance, to accelerate a turn-off delay process of the switching device 20.

Figure 8:
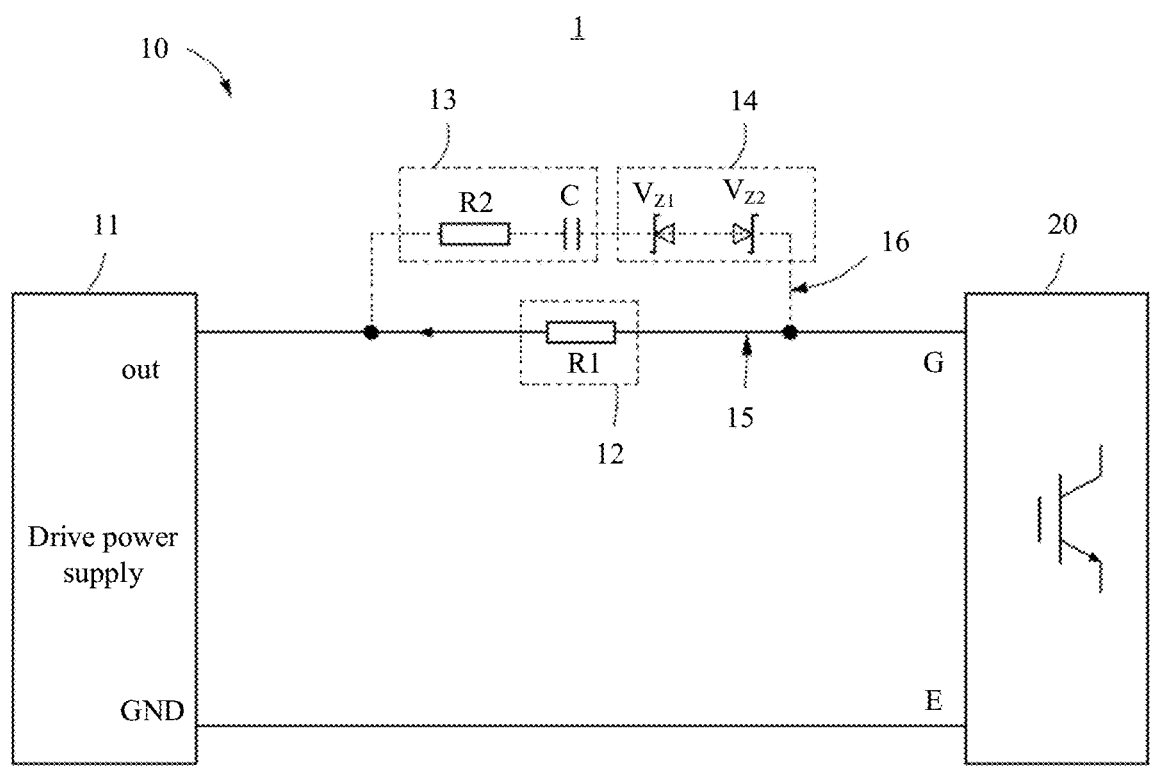
FIG. 8 is a schematic diagram of a structure of an equivalent circuit of the circuit system in FIG. 4 in a turn-off action period of a switching device.

Refer to FIG. 8. The second zener diode $V_{Z2}$ is cut off in the turn-off action period $T_5$, so that the second signal route 16 is in an open state. At this time, only the first signal route 15 is closed, and the switching device 20 is discharged only by using the first signal route 15. A discharging speed is reduced, and a small current change rate is maintained for the switching device 20, thereby avoiding a risk of stress.

Although the voltage $V_G$ of the control end G is already greater than +5V in a period following the turn-off action period $T_5$ of the switching device 20 and the switching device 20 has been turned off, to prevent the switching device 20 from being erroneously turned on due to fluctuation of the drive signal, a low level of the drive signal needs to be less than +5V. Therefore, the voltage $V_G$ of the control end G continues to decrease to −5V after decreasing to less than +5V.

It should be understood that in another embodiment, a voltage $V_G$ of the control end G may not be +15V during normal operation of the switching device 20, and a voltage $V_G$ of the control end G may not be −5V when the switching device 20 is turned off. The foregoing voltage values in this embodiment are merely intended for illustrative description.

It can be learned, from the foregoing working process of the circuit system 1, that the drive acceleration unit 13 accelerates normal turn-on delay and turn-off delay processes in the turn-on delay period $T_1$ and the turn-off delay period $T_4$, but does not accelerate normal turn-on and turn-off processes of the switching device 20. When the switching device 20 reaches the miller plateau, a corresponding zener diode ($V_{Z1}$ or $V_{Z2}$) in the selective conduction unit 14 is cut off, to control the second signal route 16 in which the drive acceleration unit 13 is located to be in an open state, so that charging and discharging processes of the switching device 20 are not accelerated, achieving a stable current change rate for the switching device 20. This can effectively suppress a voltage spike and reduce a risk of stress to the switching device 20, thereby solving the foregoing technical problem that stress of the switching device 20 is prone to increase when the drive signal has a small pulse width.

To accurately control the second signal route 16 to be in an open state in the turn-on action period $T_2$ and the turn-off action period $T_5$ of the switching device 20 (namely when the switching device 20 is at the miller plateau), zener diodes $V_{Z1}$ and $V_{Z2}$ with matching working voltages need to be selected based on the threshold voltage of the switching device 20 and the high level and the low level of the drive signal.

In this embodiment, turn-on and turn-off speeds of the switching device 20 are related to values of the capacitor C, the first resistor R1, and the second resistor R2. A capacitor C with a specific capacitance value and a first resistor R1 and a second resistor R2 with specific resistance values may be selected to achieve specific turn-on and turn-off speeds. A larger capacitance value and a smaller resistance value mean larger charging and discharging currents and faster charging and discharging speeds of the switching device 20. A smaller capacitance value and a larger resistance value mean smaller charging and discharging currents and slower charging and discharging speeds of the switching device 20.

In this embodiment, a resistance value of the first resistor R1 is greater than a resistance value of the second resistor R2. In this way, when the second signal route 16 is open, and the first signal route 15 is used for charging and discharging, charging and discharging currents are small, and a current change rate is small. This is conducive to normal turn-on and turn-off of the switching device 20, thereby reducing a risk of stress to the switching device 20.

In a variant embodiment, the first zener diode $V_{Z1}$ and/or the second zener diode $V_{Z2}$ may alternatively be replaced by another semiconductor device such as a transient voltage suppressor (Transient Voltage Suppressor, TVS) or a switching device. In another variant embodiment, circuit structures of the basic drive unit 12 and the drive acceleration unit 13 may alternatively be different, provided that a charging and discharging path can be provided.

In this embodiment, by using a working characteristic of the first zener diode $V_{Z1}$, the first zener diode $V_{Z1}$ is made to enter a reverse breakdown state in the turn-on delay period $T_1$ of the switching device 20 and to be cut off in the turn-on action period $T_2$, thereby controlling the drive acceleration unit 13 to be included in the drive acceleration circuit 10 or excluded from the drive acceleration circuit 10. Similarly, by using a working characteristic of the second zener diode $V_{Z2}$, the second zener diode $V_{Z2}$ is made to enter a reverse breakdown state in the turn-off delay period $T_4$ of the switching device 20 and to be cut off in the turn-off action period $T_5$, thereby controlling the drive acceleration unit 13 to be included in the drive acceleration circuit 10 or excluded from the drive acceleration circuit 10.

In another variant embodiment, the selective conduction unit 14 includes the first zener diode $V_{Z1}$ or the second zener diode $V_{Z2}$, rather than including the first zener diode $V_{Z1}$ and the second zener diode $V_{Z2}$. In other words, in another variant embodiment, the selective conduction unit 14 may include only one of the first zener diode $V_{Z1}$ and the second zener diode $V_{Z2}$. For example, refer to FIG. 9. When the selective conduction unit 14 includes the first zener diode $V_{Z1}$, the selective conduction unit 14 is configured to control a working status of the second signal route 16 in a turn-on process (including the turn-on delay period $T_1$ and the turn-on action period $T_2$) of the switching device 20. For example, refer to FIG. 10. When the selective conduction unit 14 includes the second zener diode $V_{Z2}$, the selective conduction unit 14 is configured to control a working status of the second signal route 16 in a turn-off process (including the turn-off delay period $T_4$ and the turn-off action period $T_5$) of the switching device 20.

Figure 9:
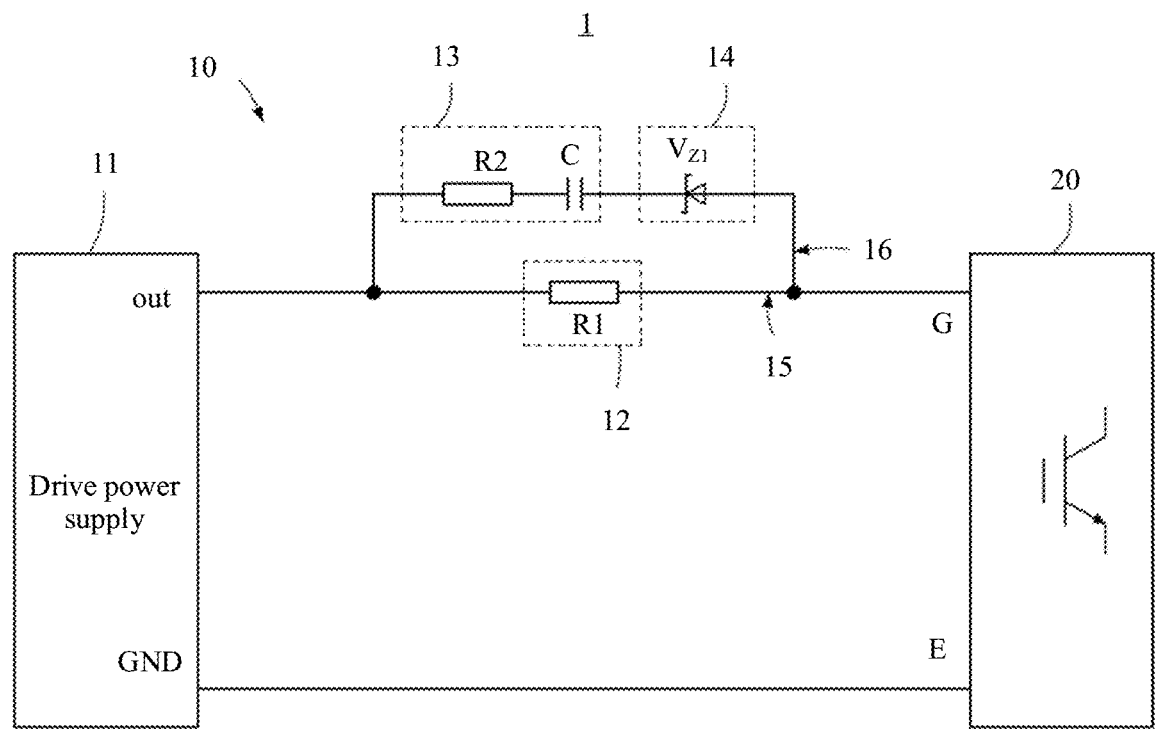
FIG. 9 is a schematic diagram of a circuit structure of a circuit system according to an embodiment of this application.
Figure 10:
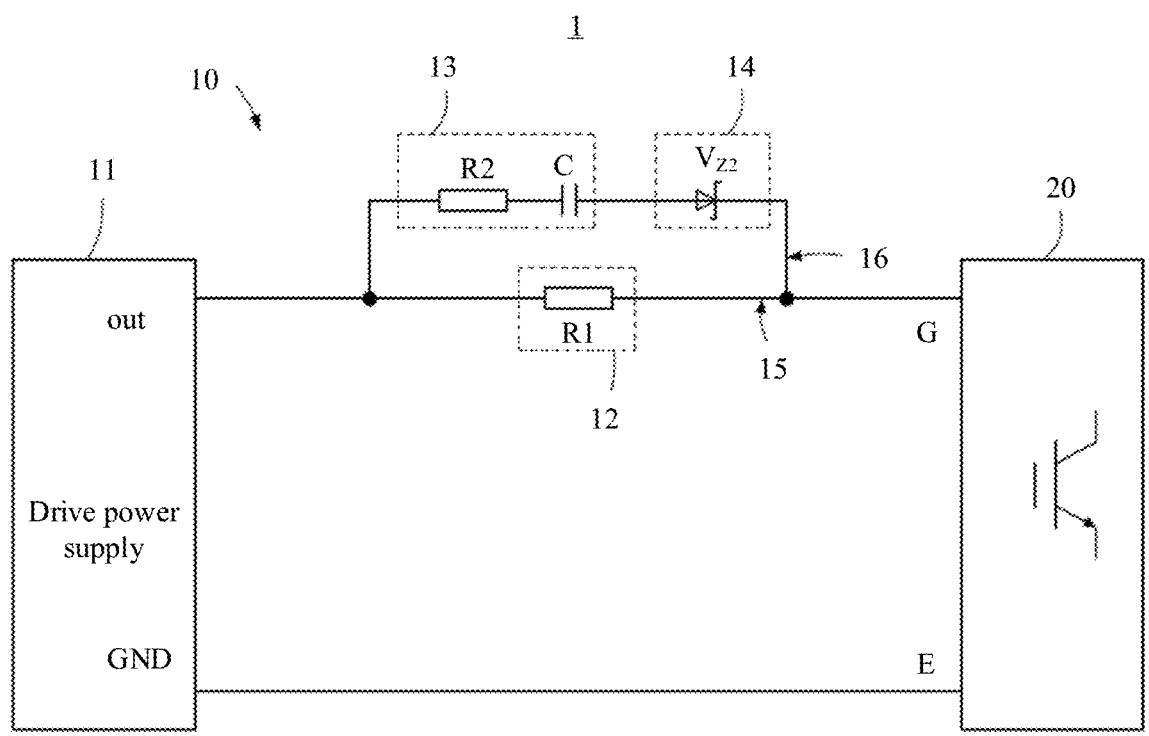
FIG. 10 is a schematic diagram of a circuit structure of a circuit system according to another embodiment of this application.

In the variant embodiments shown in FIG. 9 and FIG. 10, the selective conduction unit 14 includes only one of the first zener diode $V_{Z1}$ and the second zener diode $V_{Z2}$. This is conducive to meeting requirements of switching devices 20 in different circuit systems.

Figure 11:
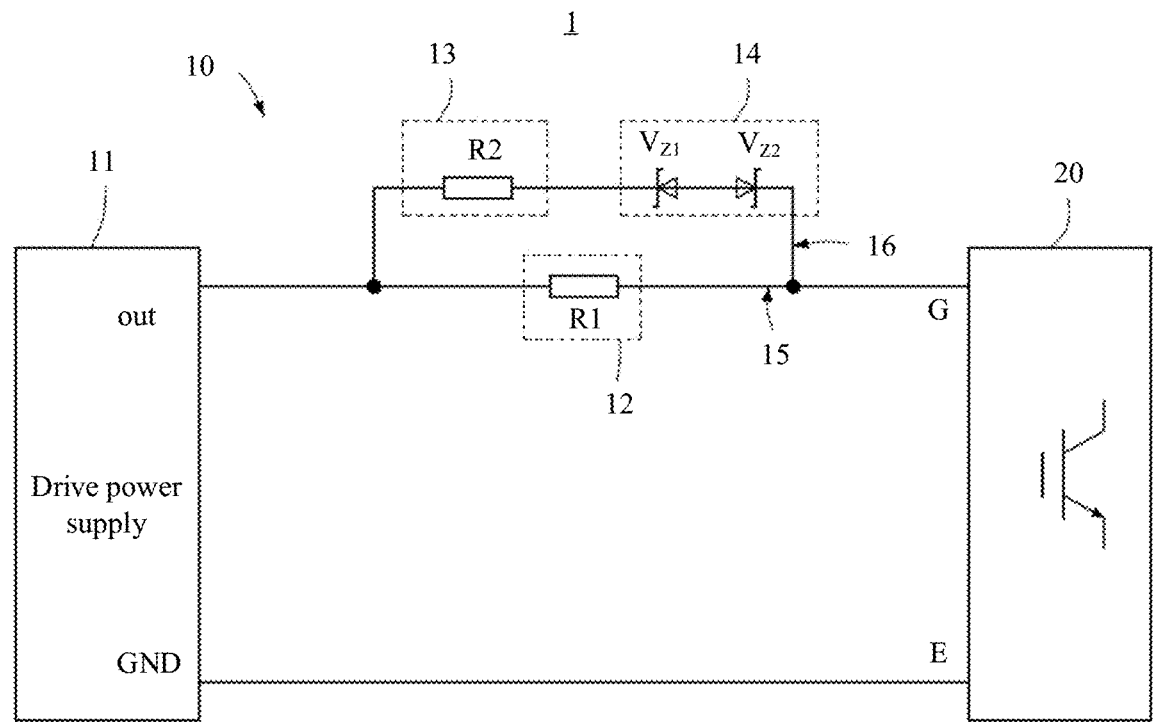
FIG. 11 is a schematic diagram of a circuit structure of a circuit system according to another embodiment of this application.

Refer to FIG. 11. In another variant embodiment, the drive acceleration unit 13 does not include a capacitor C. In this variant embodiment, a resistance value of the second resistor R2 is far less than a resistance value of the first resistor R1. Therefore, charging and discharging currents of the second signal route 16 are far greater than charging and discharging currents of the first signal route 15, and the switching device 20 can be rapidly charged and discharged by using the second signal route 16, thereby achieving rapid turn-on or turn-off.

Figure 12:
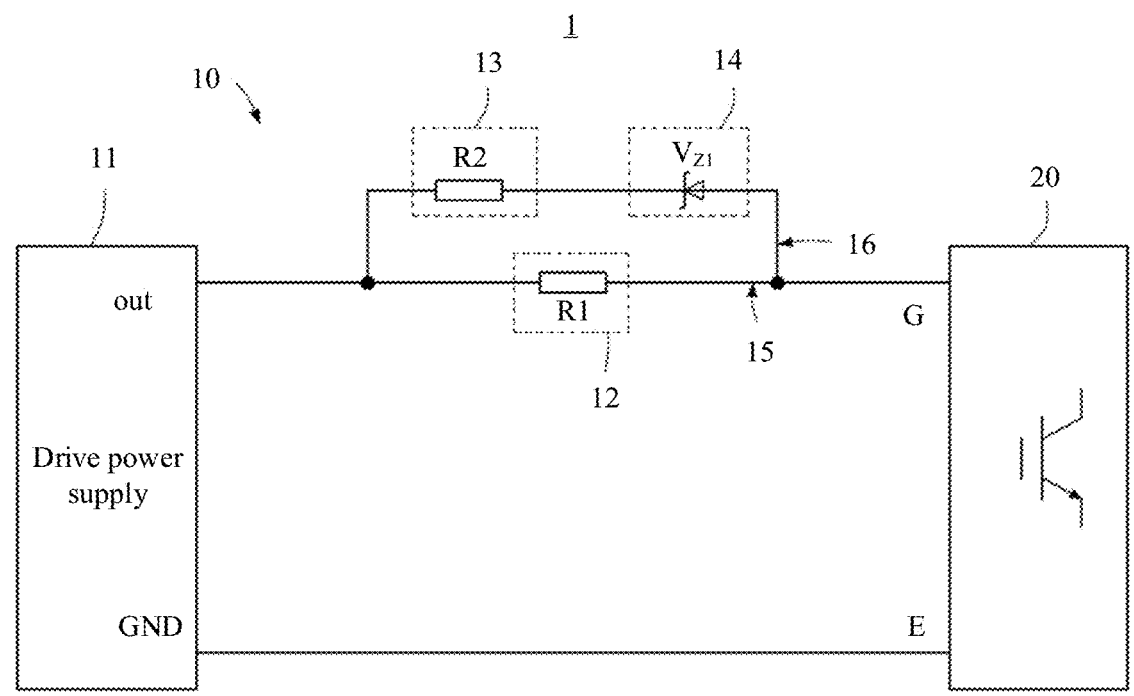
FIG. 12 is a schematic diagram of a circuit structure of a circuit system according to another embodiment of this application.
Figure 13:
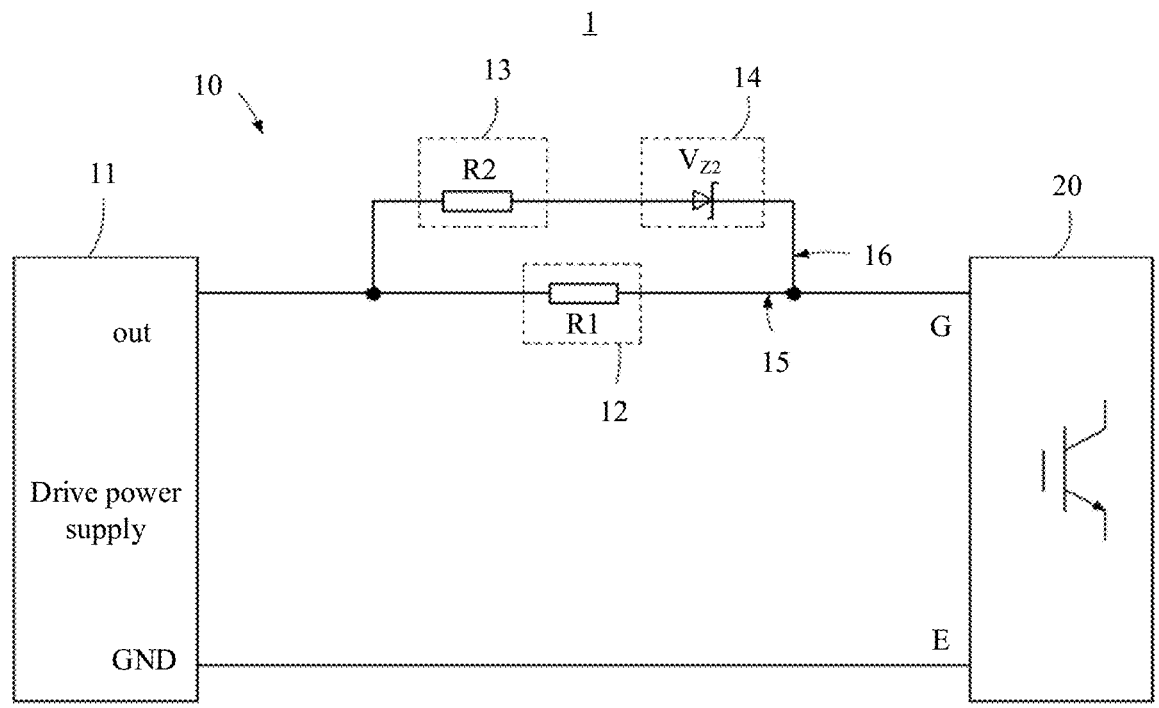
FIG. 13 is a schematic diagram of a circuit structure of a circuit system according to another embodiment of this application.

Refer to FIG. 12 and FIG. 13. In a variant embodiment in which the drive acceleration unit 13 does not include a capacitor C, selective conduction unit 14 may include only one of the first zener diode $V_{Z1}$ and the second zener diode $V_{Z2}$, as shown in FIG. 8 and FIG. 10. Details are not described herein again.

In summary, the circuit system 1 of this embodiment includes the drive acceleration circuit 10. The drive acceleration circuit 10 includes the selective conduction unit 14. The selective conduction unit 14 is configured to control the drive acceleration unit 13 to be in a closed state in the turn-on delay period $T_1$ and the turn-off delay period $T_4$, to shorten the turn-on delay period $T_1$ and the turn-off delay period $T_4$. The selective conduction unit 14 is further configured to control the drive acceleration unit 13 to be in an open state in the turn-on action period $T_2$ and the turn-off action period $T_5$, so that the turn-on action period $T_2$ and the turn-off action period $T_5$ are not shortened. In this way, the drive acceleration circuit 10 implements selective acceleration of charging and discharging processes of the switching device 20. This further accelerates normal turn-on and turn-off processes while ensuring shortened turn-on and turn-off delays. This effectively suppresses a voltage spike and reduces a risk of stress to the switching device 20, thereby solving the foregoing technical problem that stress of the switching device is prone to increase when the drive signal has a small pulse width.

Embodiment 2

Figure 14:
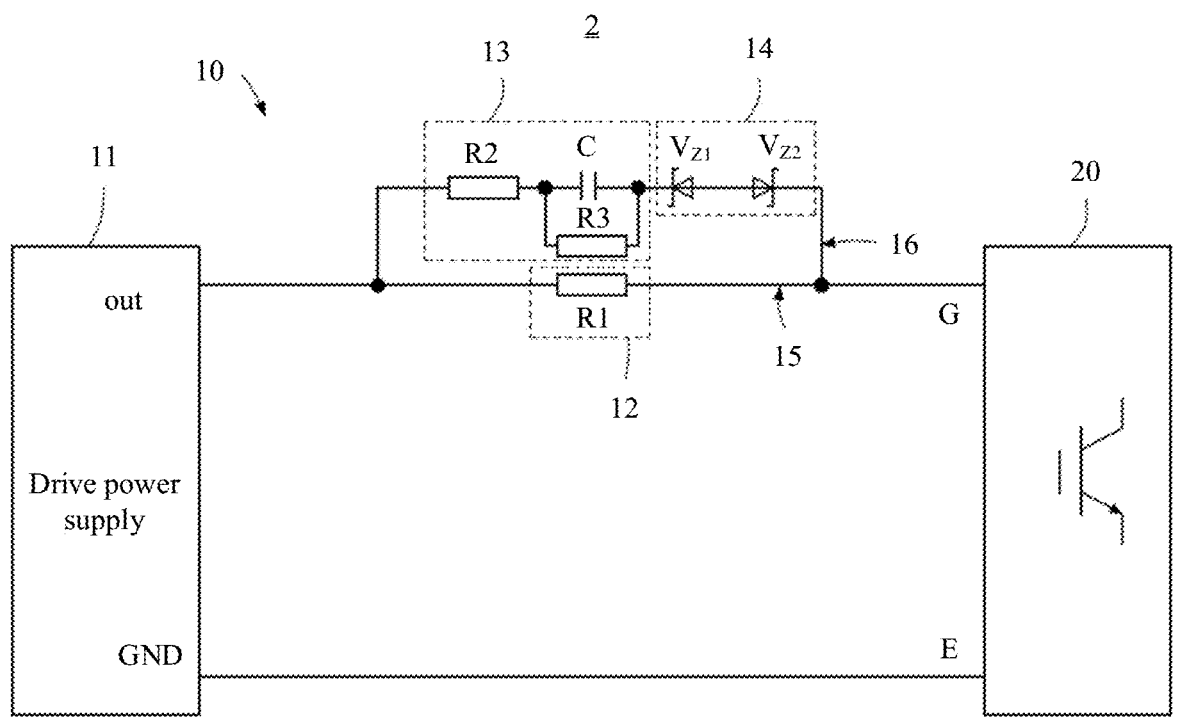
FIG. 14 is a schematic diagram of a circuit structure of a circuit system according to an embodiment of this application.

Refer to FIG. 14. A main difference of a circuit system 2 in this embodiment from the circuit system 1 in the embodiments shown in FIG. 4 to FIG. 10 lies in that a drive acceleration unit 13 in a second signal route 16 further includes a third resistor R3. The third resistor R3 is connected in series with a second resistor R2, and the third resistor R3 is connected in parallel with a capacitor C. In this embodiment, a resistance value of the third resistor R3 is far greater than resistance values of a first resistor R1 and the second resistor R2, and the resistance value of the second resistor R2 is less than the resistance value of the first resistor R1. In this embodiment, the capacitor C and the third resistor R3 are included in the second signal route 16 in a time division manner.

In this embodiment, in a turn-on delay period $T_1$, the switching device 20 is charged by using a first signal route 15 and the second signal route 16. Specifically, the switching device 20 is charged by using the second resistor R2 and the capacitor C in the second signal route 16, so that the drive acceleration unit 13 accelerates a turn-on process of the switching device 20 in the turn-on delay period $T_1$.

In a turn-on action period $T_2$, the capacitor C in the drive acceleration unit 13 has been charged to a specific voltage. At this time, a path including the second resistor R2 and the third resistor R3 is closed. A total resistance value of the second signal route 16 is a sum of the resistance values of the second resistor R2 and the third resistor R3, and is far greater than the resistance value of the first resistor R1 in the first signal route 15. At this time, although both the first signal route 15 and the second signal route 16 are in a closed state, a resistance value on the second signal route 16 is far greater than a resistance value on the first signal route 15. Therefore, a charging current on the second signal route 16 is far smaller than a charging current on the first signal route 15. In other words, at this time, the switching device 20 is mainly charged by using the first signal route 15. A current change rate is small, so that normal turn-on of the switching device 20 is not affected.

In a turn-off delay period $T_4$, a drive signal is jumped to a low level, and the switching device 20 starts to perform discharging. At this time, both the first signal route 15 and the second signal route 16 are closed. Specifically, the switching device 20 is discharged by using the second resistor R2 and the capacitor C in the second signal route 16, so that the drive acceleration unit 13 accelerates a discharging process of the switching device 20 in the turn-off delay period $T_4$.

In a turn-off action period $T_5$, the capacitor C in the drive acceleration unit 13 is in an open state. At this time, a path including the second resistor R2 and the third resistor R3 is closed, and the switching device 20 is also charged and discharged by using the first signal route 15 and the second signal route 16. Specifically, the switching device 20 is charged and discharged by using the second resistor R2 and the third resistor R3 in the second signal route 16. A total resistance value of the second signal route 16 is far greater than a total resistance value of the first signal route 15. Therefore, a discharging current of the first signal route 15 is far greater than a discharging current of the second signal route 16. In other words, the switching device 20 is mainly discharged by using the first signal route 15. A current change rate is small, so that normal turn-off of the switching device 20 is not affected.

In other words, in this embodiment, even if the second signal route 16 is not disconnected by the selective conduction unit 14, after the capacitor C is fully charged, the capacitor C can be excluded from the second signal route 16, so that the third resistor R3 is included, in place of the capacitor C, in the second signal route 16. Therefore, this can also effectively improve turn-on and turn-off speeds of the switching device 20.

Figure 15:
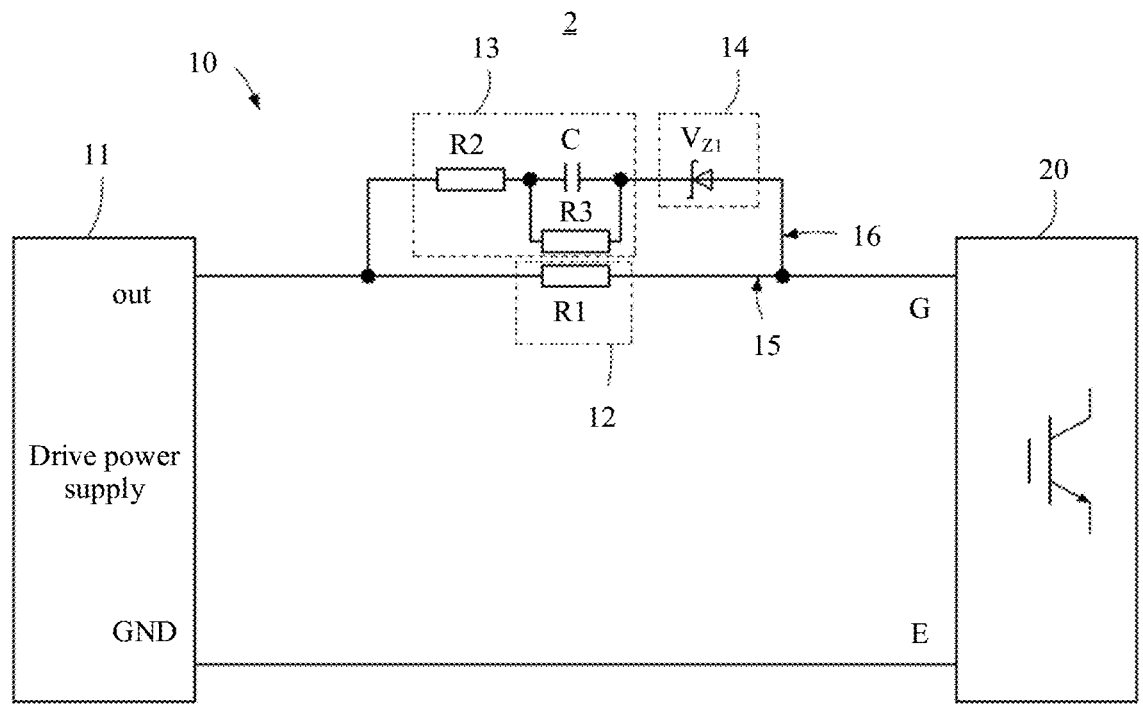
FIG. 15 is a schematic diagram of a circuit structure of a circuit system according to an embodiment of this application.
Figure 16:
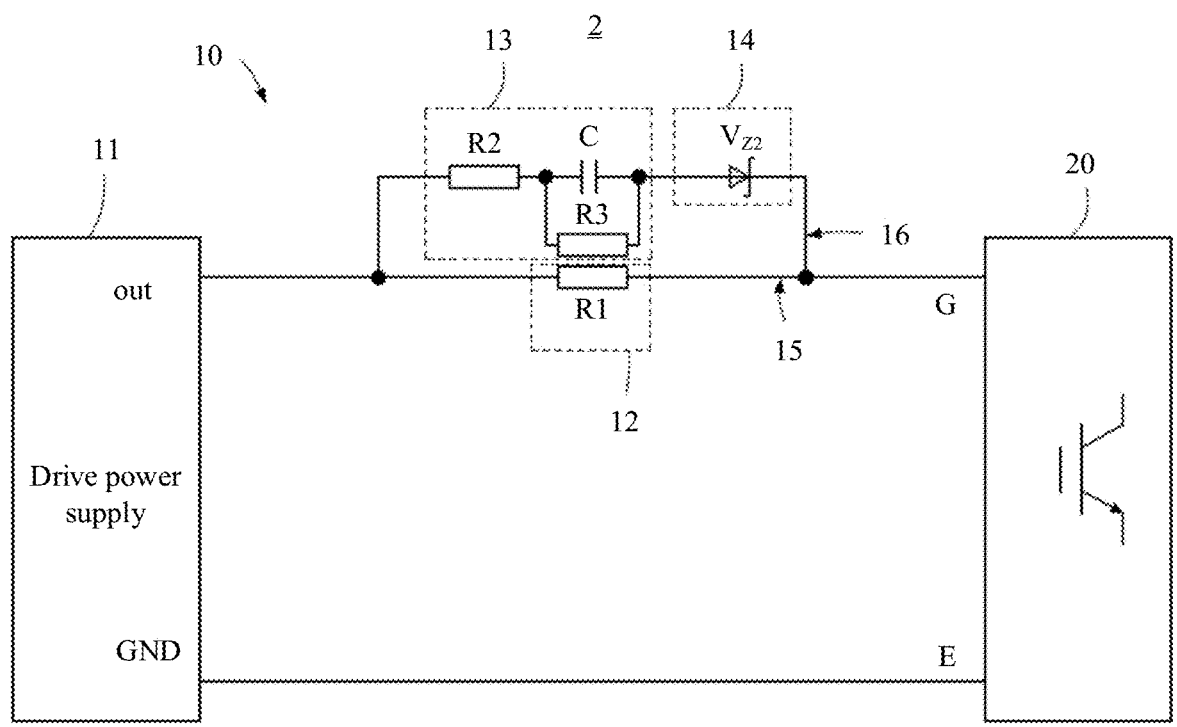
FIG. 16 is a schematic diagram of a circuit structure of a circuit system according to another embodiment of this application.

Refer to FIG. 15 and FIG. 16. In a variant embodiment of this embodiment, the selective conduction unit 14 may include only one of the first zener diode $V_{Z1}$ and the second zener diode $V_{Z2}$, similar to the embodiments shown in FIG. 9 and FIG. 10. Details are not described herein again.

In summary, the circuit system 2 and a drive acceleration circuit 10 of this embodiment can achieve all beneficial effects described in Embodiment 1. In addition, when the second signal route 16 is not disconnected by the selective conduction unit 14, a charging/discharging status of the capacitor C may be further used to control the second signal route 16 to be included or excluded.

Embodiment 3

Figure 17:
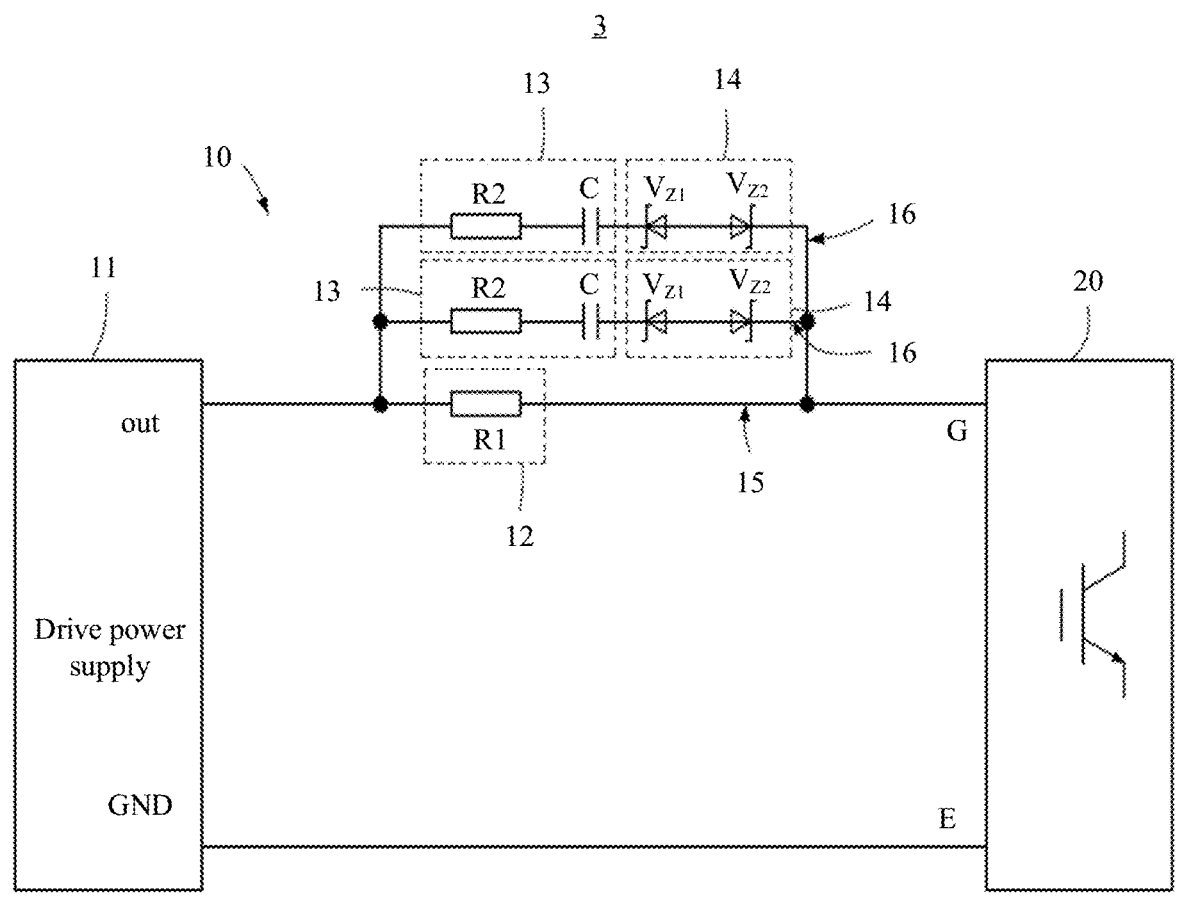
FIG. 17 is a schematic diagram of a circuit structure of a circuit system according to an embodiment of this application.

Refer to FIG. 17. A main difference of a circuit system 3 in this embodiment from the circuit system 1 in Embodiment 1 and the circuit system 2 in Embodiment 2 lies in that a drive acceleration circuit 10 includes at least two second signal routes 16. The second signal routes 16 are connected with each other in parallel. In this embodiment, as an example for description, two second signal routes 16 are included.

In this embodiment, the second signal routes 16 work in a time division manner. When closed, the second signal routes 16 have different charging/discharging currents. In this embodiment, second resistors R2 with different resistance values or/and capacitors C with different capacitance values are selected, so that the second signal routes 16 have different charging/discharging currents when closed. In this embodiment, a first zener diode $V_{Z1}$ and a second zener diode $V_{Z2}$ in the selective conduction unit 14 have different breakdown voltages, so that the second signal routes 16 are closed in a time division manner. In other words, the second signal routes 16 are not closed at the same time.

In this way, in a turn-on delay period $T_1$ and a turn-off delay period $T_4$, the two second signal routes 16 are controlled, by using the selective conduction unit 14 in each second signal route 16, to be closed in a time division manner. In this way, the switching device 20 has different charging/discharging speeds in sub-periods of the turn-on delay period $T_1$ and the turn-off delay period $T_4$. For example, for each second signal route 16, a charging/discharging current when the second signal route 16 is closed may be set, to control charging/discharging speeds of the switching device 20 in the sub-periods of the turn-on delay period $T_1$ and the turn-off delay period $T_4$ to gradually decrease, until a charging/discharging speed at a miller plateau is reached.

Figure 18:
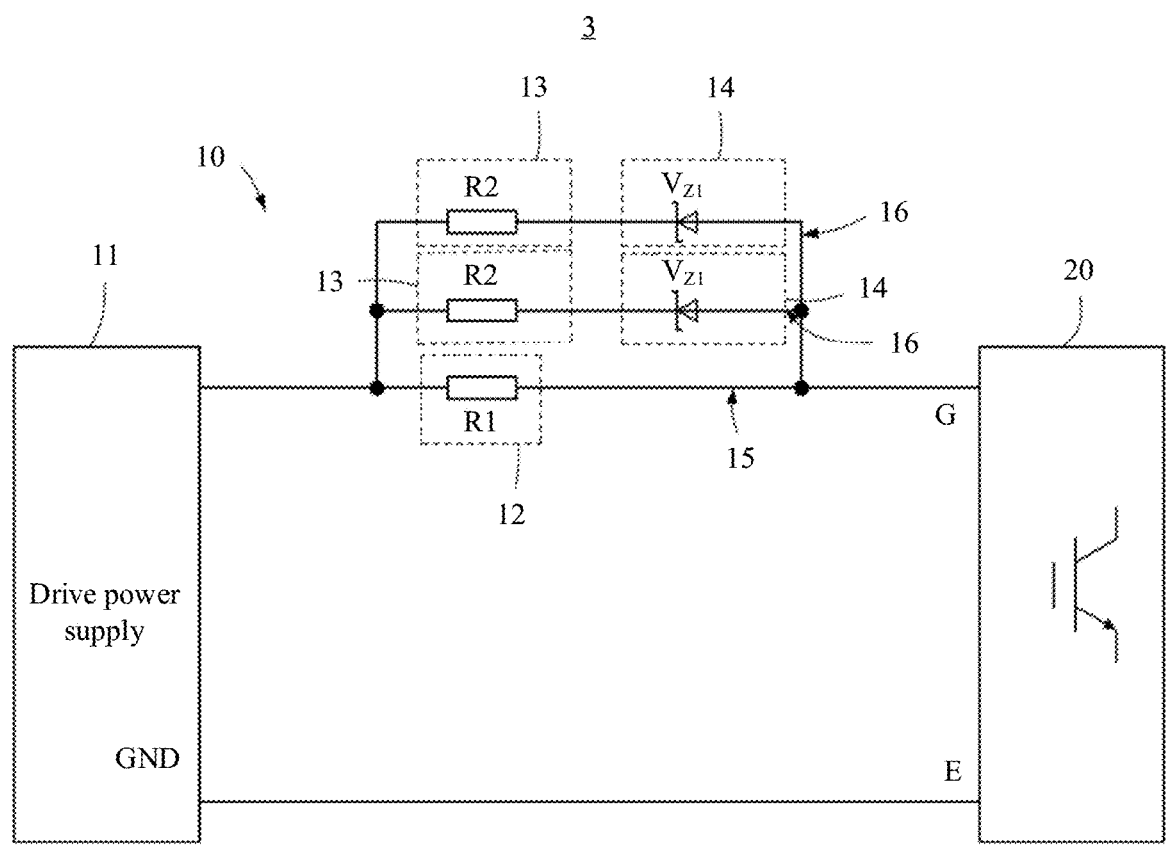
FIG. 18 is a schematic diagram of a circuit structure of a circuit system according to an embodiment of this application.
Figure 19:
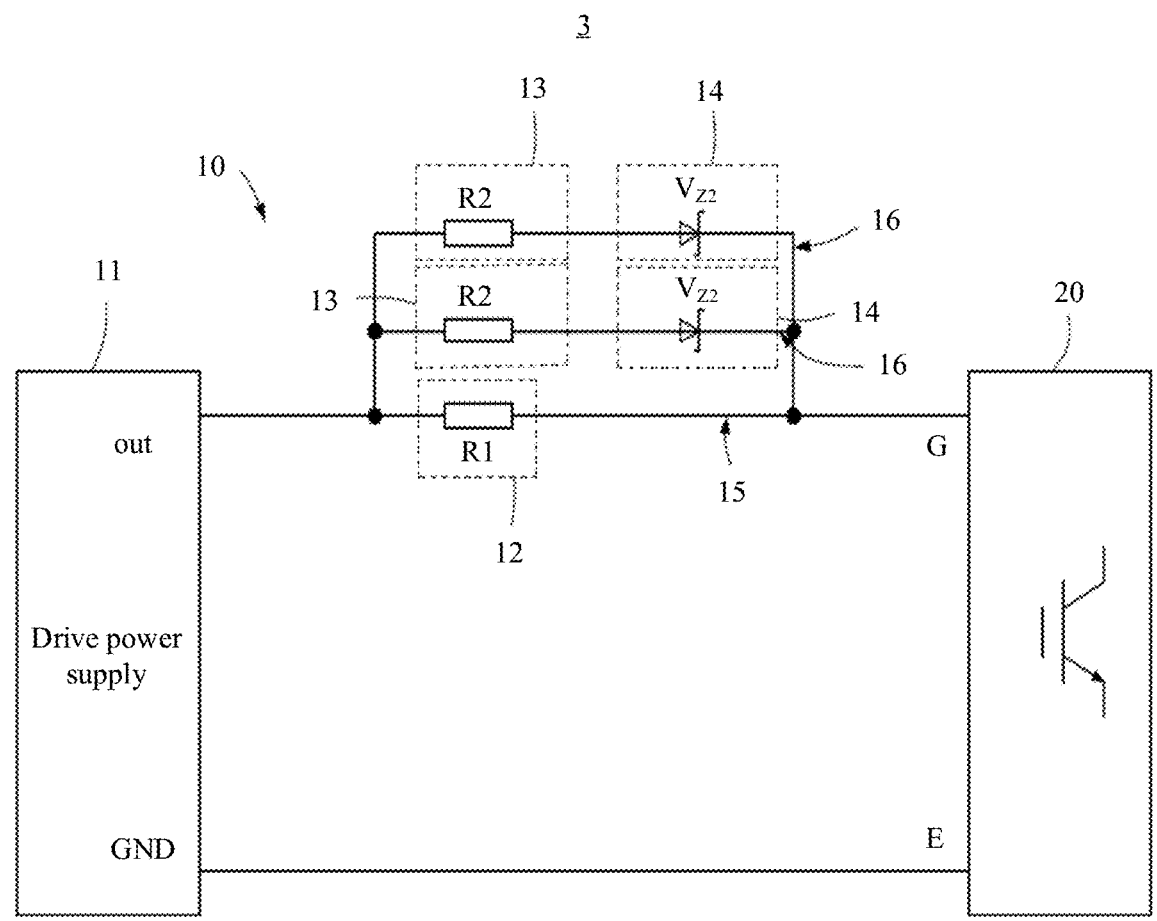
FIG. 19 is a schematic diagram of a circuit structure of a circuit system according to an embodiment of this application.

In the drive acceleration circuit 10 of this embodiment, a structure of each second signal route 16 may be the same as a structure of any second signal route 16 described in Embodiment 1 and Embodiment 2, for example, structures in examples shown in FIG. 18 and FIG. 19. Details are not described herein again.

The circuit system 3 and the drive acceleration circuit 10 of this embodiment can achieve all beneficial effects described in Embodiment 1 and Embodiment 2. In addition, the switching device 20 may further be controlled to have gradient charging/discharging speeds in turn-on and turn-off processes.

A person with ordinary skills in the art should be aware that the foregoing implementations are merely intended for describing the present invention, rather than for limiting the present invention. Any appropriate modifications and changes made to the foregoing embodiments within the scope of the present invention shall fall within the protection scope claimed by the present invention.

What is claimed is:

1. A drive acceleration circuit, comprising:
    a drive power supply, comprising an output end and a reference signal end, wherein the output end is configured to output a drive signal, and the reference signal end is coupled to a connection end of a switching device and is configured to output a reference signal to the connection end;
    a first signal route, wherein the first signal route is coupled to the output end of the drive power supply and a control end of the switching device, and is configured to drive, based on the drive signal, the switching device to turn on or turn off; and
    a second signal route, which is connected in parallel with the first signal route, wherein the second signal route comprises a drive acceleration unit and a selective conduction unit, one end of the drive acceleration unit is coupled to the output end of the drive power supply, another end of the drive acceleration unit is coupled to the control end of the switching device through the selective conduction unit, the selective conduction unit is turned on in a time division manner to make the second signal route closed or open, and the drive acceleration unit is configured to accelerate the turn on and turn off of the switching device based on the drive signal when the second signal route is closed; and the drive acceleration circuit is configured to drive the switching device to turn on or turn off, wherein the switching device has the control end and the connection end, wherein charging of the switching device is accelerated when the second signal route is closed and the switching device is turned off and discharging of the switching device is accelerated when the second signal route is closed and the switching device is turned on.

2. The drive acceleration circuit according to claim 1, wherein the selective conduction unit comprises at least one semiconductor device, one end of the at least one semiconductor device is connected to the drive acceleration unit, another end of the at least one semiconductor device is connected to the control end of the switching device, and the at least one semiconductor device is turned on or off in a time division manner to make the second signal route closed or open.

3. The drive acceleration circuit according to claim 2, wherein the at least one semiconductor device is a zener diode, a transient voltage suppressor, or a switching device.

4. The drive acceleration circuit according to claim 2, wherein the selective conduction unit comprises two semiconductor devices, and either of the semiconductor devices is a zener diode or a transient voltage suppressor; and anodes of the two semiconductor devices are coupled to each other, a cathode of one semiconductor device is coupled to the drive acceleration unit, and a cathode of the other semiconductor device is coupled to the control end of the switching device.

5. The drive acceleration circuit according to claim 3, wherein the selective conduction unit comprises two semiconductor devices, and either of the semiconductor devices is a zener diode or a transient voltage suppressor; and anodes of the two semiconductor devices are coupled to each other, a cathode of one semiconductor device is coupled to the drive acceleration unit, and a cathode of the other semiconductor device is coupled to the control end of the switching device.

6. The drive acceleration circuit according to claim 1, wherein the drive acceleration circuit comprises at least two second signal routes that are connected in parallel, and the at least two second signal routes are closed in a time division manner.

7. The drive acceleration circuit according to claim 2, wherein the drive acceleration circuit comprises at least two second signal routes that are connected in parallel, and the at least two second signal routes are closed in a time division manner.

8. The drive acceleration circuit according to claim 6, wherein the second signal routes are of the same structure.

9. The drive acceleration circuit according to claim 6, wherein the second signal routes have different resistance values.

10. The drive acceleration circuit according to claim 1, wherein the second signal route is configured to be in a closed state when the switching device is in a turn-off delay period, and to be in an open state when the switching device is in a turn-off action period; or the second signal route is configured to be in a closed state both when the switching device is in a turn-off delay period and when the switching device is in a turn-off action period.

11. The drive acceleration circuit according to claim 2, wherein the second signal route is configured to be in a closed state when the switching device is in a turn-off delay period, and to be in an open state when the switching device is in a turn-off action period; or the second signal route is configured to be in a closed state both when the switching device is in a turn-off delay period and when the switching device is in a turn-off action period.

12. The drive acceleration circuit according to claim 1, wherein the second signal route is configured to be in a closed state when the switching device is in a turn-on delay period, and to be in an open state when the switching device is in a turn-on action period; or the second signal route is configured to be in a closed state both when the switching device is in a turn-on delay period and when the switching device is in a turn-on action period.

13. The drive acceleration circuit according to claim 2, wherein the second signal route is configured to be in a closed state when the switching device is in a turn-on delay period, and to be in an open state when the switching device is in a turn-on action period; or the second signal route is configured to be in a closed state both when the switching device is in a turn-on delay period and when the switching device is in a turn-on action period.

14. The drive acceleration circuit according to claim 1, wherein the drive acceleration unit comprises any one or combination of a resistor, a capacitor, and a diode, one end of one of the resistor, the capacitor, and the diode or one end of any combination of the resistor, the capacitor, and the diode that are connected in series or parallel is coupled to the output end of the drive power supply, and another end thereof is coupled to the selective conduction unit.

15. The drive acceleration circuit according to claim 14, wherein the first signal route comprises a first resistor, one end of the first resistor is connected to the output end of the drive power supply, and another end of the first resistor is connected to the control end of the switching device; and the drive acceleration unit comprises a second resistor, wherein one end of the second resistor is connected to the output end of the drive power supply, and another end of the second resistor is connected to the selective conduction unit.

16. The drive acceleration circuit according to claim 15, wherein a resistance value of the first resistor is greater than a resistance value of the second resistor.

17. The drive acceleration circuit according to claim 16, wherein the drive acceleration unit further comprises a capacitor that is connected in series with the second resistor, the one end of the second resistor is connected to the output end of the drive power supply, the another end of the second resistor is connected to the capacitor, another end of the capacitor is connected to the selective conduction unit, and the capacitor is configured to perform charging or discharging when the second signal route is closed.

18. The drive acceleration circuit according to claim 17, wherein the drive acceleration unit further comprises a third resistor, the third resistor is connected in parallel with the capacitor, one end of the third resistor is connected to the second resistor, another end of the third resistor is connected to the selective conduction unit, and the third resistor and the capacitor are comprised in the second signal route in a time division manner.

19. The drive acceleration circuit according to claim 18, wherein a sum of the resistance value of the second resistor and a resistance value of the third resistor is greater than the resistance value of the first resistor.

20. A circuit system, comprising:
   a switching device, which has a control end and a connection end; and
   a drive acceleration circuit, wherein the drive acceleration circuit comprises:
   a drive power supply, comprising an output end and a reference signal end, wherein the output end is configured to output a drive signal, and the reference signal end is coupled to the connection end of the switching device and is configured to output a reference signal to the connection end;
   a first signal route, wherein the first signal route is coupled to the output end of the drive power supply and the control end of the switching device, and is configured to drive, based on the drive signal, the switching device to turn on or turn off; and
   a second signal route, which is connected in parallel with the first signal route, wherein the second signal route comprises a drive acceleration unit and a selective conduction unit, one end of the drive acceleration unit is coupled to the output end of the drive power supply, another end of the drive acceleration unit is coupled to the control end of the switching device through the selective conduction unit, the selective conduction unit is turned on in a time division manner to make the second signal route closed or open, and the drive acceleration unit is configured to accelerate the turn on and turn off of the switching device based on the drive signal when the second signal route is closed; and the drive acceleration circuit is configured to drive the switching device to turn on or turn off, wherein the switching device has the control end and the connection end; and the drive acceleration circuit is coupled to the control end and the connection end of the switching device, and is configured to accelerate a turn on and a turn offan on/off process of the switching device, wherein charging of the switching device is accelerated when the second signal route is closed and the switching device is turned off and discharging of the switching device is accelerated when the second signal route is closed and the switching device is turned on.

\* \* \* \* \*